United States Patent
Lin et al.

(10) Patent No.: US 7,288,828 B2
(45) Date of Patent: Oct. 30, 2007

(54) METAL OXIDE SEMICONDUCTOR TRANSISTOR DEVICE

(75) Inventors: Huan-Shun Lin, Taichung (TW);
Chen-Hua Tsai, Hsinchu County (TW);
Wei-Tsun Shiau, Kaohsiung County (TW); Hsien-Liang Meng, Hsinchu (TW); Hung-Lin Shih, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/163,124

(22) Filed: Oct. 5, 2005

(65) Prior Publication Data

US 2007/0075378 A1    Apr. 5, 2007

(51) Int. Cl.
*H01L 27/082* (2006.01)

(52) U.S. Cl. .............. 257/586; 257/171; 257/618; 257/623; 257/625; 257/E29.329; 257/E21.428; 438/282; 438/297; 438/343; 438/412; 438/481

(58) Field of Classification Search .............. None
See application file for complete search history.

(56) References Cited

U.S. PATENT DOCUMENTS

| | | | | |
|---|---|---|---|---|
| 4,914,500 A | * | 4/1990 | Liu et al. ............... | 257/384 |
| 5,759,901 A | * | 6/1998 | Loh et al. ............... | 438/305 |
| 5,783,478 A | * | 7/1998 | Chau et al. ............. | 438/592 |
| 6,074,919 A | * | 6/2000 | Gardner et al. ......... | 438/287 |
| 6,184,114 B1 | * | 2/2001 | Lukanc .................. | 438/585 |
| 6,246,091 B1 | * | 6/2001 | Rodder .................. | 257/335 |
| 6,541,279 B2 | * | 4/2003 | Hayashi et al. ......... | 438/3 |
| 6,573,534 B1 | * | 6/2003 | Kumar et al. ........... | 257/77 |
| 2005/0112857 A1 | * | 5/2005 | Gluschenkov et al. ... | 438/585 |

* cited by examiner

*Primary Examiner*—Evan Pert
*Assistant Examiner*—Scott R. Wilson
(74) *Attorney, Agent, or Firm*—Jianq Chyun IP Office

(57) ABSTRACT

A metal-oxide-semiconductor (MOS) transistor device is provided. The MOS transistor device includes a substrate, a gate structure, a spacer, a source/drain region and a barrier layer. The gate structure is disposed on the substrate. The gate structure includes a gate and a gate dielectric layer disposed between the gate and the substrate. The spacer is disposed on the sidewall of the gate structure. The source/drain region is disposed in the substrate on two sides of the spacer. The barrier layer is disposed around the source/drain region. The source/drain region and the barrier layer are fabricated using an identical material. However, the doping concentration of the source/drain region is larger than the doping concentration of the barrier layer.

19 Claims, 5 Drawing Sheets

METAL OXIDE SEMICONDUCTOR TRANSISTOR DEVICE

BACKGROUND OF THE INVENTION

1. Field of the Invention

The present invention relates to a semiconductor device. More particularly, the present invention relates to a metal oxide semiconductor (MOS) transistor device.

2. Description of the Related Art

Metal-oxide-semiconductor (MOS) transistor is one of the most important element in very large scale integrated (VLSI) circuits. The applications of MOS transistors are far and wide. In fact, microprocessors, semiconductor memory devices, power devices and so on can use MOS transistors as the basic elements. In general, a MOS transistor can be categorized as a P-type MOS transistor and an N-type MOS transistor. P-type MOS transistors have source/drain regions doped with trivalent impurities such as boron and N-type MOS transistors have source/drain regions doped with pentavalent impurities such as phosphorus or arsenic.

However, the dopants such as phosphorus, arsenic or boron inside the source/drain regions may diffuse into the channel region when a subsequent heat treatment process is carried out. This will lead to a device punch through that may ultimately affect overall performance of the device.

SUMMARY OF THE INVENTION

Accordingly, the present invention is to provide a metal-oxide-semiconductor (MOS) transistor device that can prevent the dopants inside the source/drain regions from diffuse into the channel region to affect the performance of the device.

The invention provides a metal-oxide-semiconductor (MOS) transistor. The MOS transistor device comprises a substrate, a gate structure, a spacer, a source/drain region and a barrier layer. The gate structure is disposed on the substrate. The gate structure includes a gate and a gate dielectric layer disposed between the gate and the substrate. The spacer is disposed on the sidewall of the gate structure. The source/drain region is disposed in the substrate on two sides of the spacer. The barrier layer is disposed around the source/drain region. The source/drain region and the barrier layer are fabricated using an identical material. However, the doping concentration of the source/drain region is larger than the doping concentration of the barrier layer.

According to MOS transistor device in the present embodiment of the present invention, the source/drain region and the barrier layer are fabricated using silicon germanium, for example.

According to MOS transistor device in the present embodiment of the present invention, the dopants inside the source/drain region are boron (B), for example.

According to MOS transistor device in the present embodiment of the present invention, the concentration of dopants inside the barrier layer is zero, for example.

According to MOS transistor device in the present embodiment of the present invention, the source/drain region and the barrier layer are fabricated using silicon carbide (SiC), for example.

According to MOS transistor device in the present embodiment of the present invention, the dopants inside the source/drain region includes phosphorus (P) or arsenic (As), for example.

According to MOS transistor device in the present embodiment of the present invention, the concentration of dopants inside the barrier layer is zero, for example.

According to MOS transistor device in the present embodiment of the present invention, the surface of the source/drain region is higher than the surface of the substrate, for example.

According to MOS transistor device in the present embodiment of the present invention, the substrate is selected from a group consisting of P-doped silicon substrate, N-doped silicon substrate, epitaxial silicon substrate, silicon-on-insulator (SOI) substrate, silicon carbide on insulator substrate, silicon germanium on insulator substrate, epitaxial silicon on insulator substrate, gallium arsenic (GaAs) substrate, indium-phosphorus (InP) substrate, silicon germanium substrate, a substrate comprising a silicon layer and a germanium layer disposed over the silicon layer, a substrate comprising a silicon carbide layer disposed over a silicon layer, and a substrate comprising a silicon germanium layer over a silicon layer, for example.

According to MOS transistor device in the present embodiment of the present invention, the material constituting the gate is selected from a group consisting of polysilicon, metal, polycide, and a composite layer comprising polysilicon and metal nitride, for example.

According to MOS transistor device in the present embodiment of the present invention, the metal nitride layer is formed using titanium nitride (TiN), for example.

According to MOS transistor device in the present embodiment of the present invention, the gate dielectric layer is fabricated using silicon oxide, silicon oxynitride or high dielectric constant material.

According to MOS transistor device in the present embodiment of the present invention, the material constituting the high dielectric constant material includes, for example, tantalum oxide ($Ta_2O_5$) or barium-strontium titanate ($(BaSr)TiO_3$), BST).

According to MOS transistor device in the present embodiment of the present invention, the spacer is fabricated using silicon oxide or silicon nitride, for example.

According to MOS transistor device in the present embodiment of the present invention, the MOS transistor device further includes a metal silicide layer disposed on the source/drain region.

According to MOS transistor device in the present embodiment of the present invention, the material constituting the metal silicide layer includes, for example, tungsten silicide (WSi), titanium silicide (TiSi), cobalt silicide (CoSi), molybdenum silicide (MoSi), nickel silicide (NiSi), palladium silicide (PdSi) or platinum silicide (PtSi).

According to MOS transistor in the present embodiment of the present invention, the MOS transistor device further includes a dielectric layer disposed on the substrate to cover the gate structure, the spacer, the source/drain region and the barrier layer.

According to MOS transistor device in the present embodiment of the present invention, the material constituting the dielectric layer includes, for example, silicon oxide, borophosphosilicate glass (BPSG), phosphosilicate glass (PSG) or low dielectric constant material.

According to MOS transistor device in the present embodiment of the present invention, the material constituting the low dielectric constant material includes, for example, black diamond, aromatic hydrocarbon (SiLK), porous aromatic hydrocarbon (porous-SiLK), hydrogen silsesquioxane (HSQ) or methyl silsesquioxane (MSQ).

The MOS transistor in the present invention uses boron-doped silicon germanium in PMOS transistor region or phosphorus- or arsenic-doped silicon carbide in NMOS transistor region to form the source/drain region so that a compressive stress or a tensile stress is produced in the channel direction of the PMOS or NMOS transistor devices. As a result, the mobility of holes and electrons is raised to increase the driving current and improve device performance. Furthermore, the closer the dopants in the source/drain region to the channel, the higher will be the stress and the better will be the device performance.

In addition, a barrier layer fabricated using silicon germanium or silicon carbide is disposed around the source/drain region. Hence, when the MOS transistor device is subjected to subsequent heat treatment processes, the boron, phosphorus or arsenic dopants within the source/drain region are prevented from diffusing into neighboring layers by the barrier layer causing possible device punch through. Furthermore, a strained channel can be maintained so that device performance will improve.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
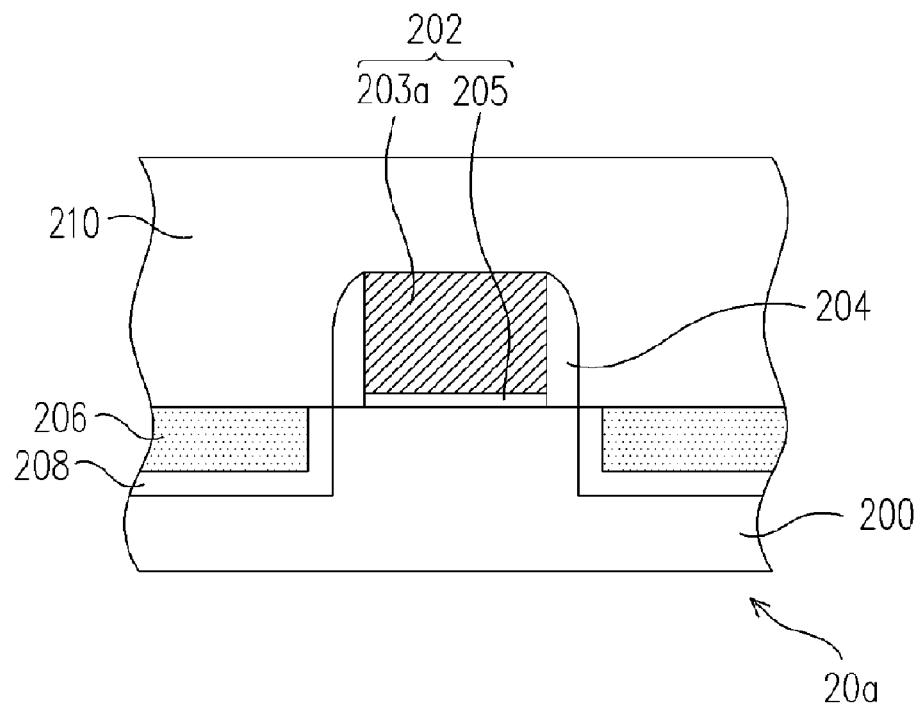
FIG. 1A is a schematic cross-sectional view of a MOS transistor device according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A is a schematic cross-sectional view of a MOS transistor device according to one embodiment of the present invention. As shown in FIG. 1A, the MOS transistor 20a comprises a substrate 200, a gate structure 202, a spacer 204, a conductive layer 206 and a barrier layer 208. The substrate 200 is a P-doped silicon substrate, an N-doped silicon substrate, an epitaxial silicon substrate, a gallium-arsenic substrate, an indium-phosphorus substrate or a silicon germanium substrate, for example. The dopants inside the P-doped substrate include boron and the dopants inside the N-doped substrate include phosphorus or arsenic, for example.

The gate structure 202 is disposed on the substrate 200. The gate structure 202 comprises a gate 203a and a gate dielectric layer 205 disposed between the gate 203a and the substrate 200. The gate 203a is fabricated using a material selected from a group consisting of polysilicon, metal or polycide, for example. The gate dielectric layer 205 is fabricated using silicon oxide, silicon oxynitride or high dielectric constant material, for example. The high dielectric constant material is a material with a dielectric constant k greater than 4. The high dielectric constant material is tantalum oxide or barium-strontium titanate, for example.

The spacers 204 are disposed on the respective sidewalls of the gate structure 202. The spacers 204 are fabricated using silicon oxide or silicon nitride, for example. The source/drain regions 206 are disposed in the substrate 200 on each side of the spacers 204. The source/drain regions 206 are fabricated using silicon germanium or silicon carbide, for example. The barrier layer 208 is disposed around the source/drain regions 206. The source/drain regions 206 and the barrier layer 208 are fabricated using an identical material. However, the dopant concentration in the source/drain regions 206 is greater than the dopant concentration in the barrier layer 208. In one embodiment, if the source/drain regions 206 and the barrier layer are fabricated from silicon germanium, the dopants inside the source/drain regions 206 are boron and the concentration of dopants inside the barrier layer 208 is zero. In another embodiment, if the source/drain regions 206 and the barrier layer 208 are fabricated from silicon carbide, the dopants inside the source/drain regions 206 are phosphorus or arsenic and the concentration of dopants inside the barrier layer 208 is zero. Using boron-doped silicon germanium or phosphorus- or arsenic-doped silicon carbide to form the source/drain region 206, a compressive stress or a tensile stress is produced in the vertical direction of the MOS transistor device 20a so that the mobility of holes and electrons is increased. Hence, the driving current is increased and the device performance is improved. Furthermore, the barrier layer around the source/drain region can prevent the doped boron, phosphorus or arsenic inside the source/drain regions 206 from diffusing into the channel region when the MOS transistor device is subjected to a subsequent heat treatment process leading to a device punch through.

In addition, a dielectric layer 210 is also disposed over the substrate 200 to cover the MOS transistor 20a. The dielectric layer 210 is fabricated using silicon oxide, borophosphosilicate glass, phosphosilicate glass or a low dielectric constant material with a dielectric constant smaller than 4, for example. The low dielectric constant material includes black diamond, Coral, aromatic hydrocarbon (SiLK, manufactured by The Dow Chemical Co.), porous aromatic hydrocarbon (porous-SiLK), hydrogen silsesquioxane (HSQ) or methyl silsesquioxane (MSQ), for example.

Figure 1B:
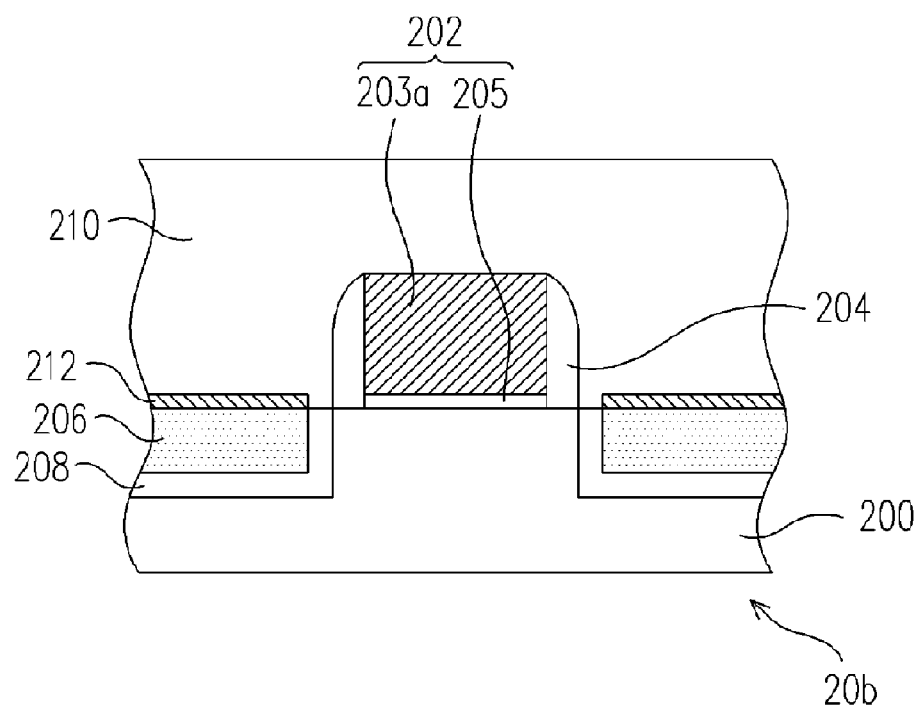
FIG. 1B is a schematic cross-sectional view of a MOS transistor device according to another embodiment of the present invention.

As shown in FIG. 1B, a metal silicide layer 212 is formed on the source/drain regions 206 of the MOS transistor device 20b to lower the sheet resistance. The metal silicide layer 212 is fabricated using tungsten silicide, titanium silicide, cobalt silicide, molybdenum silicide, nickel silicide, palladium silicide or platinum silicide, for example.

Figure 1C:
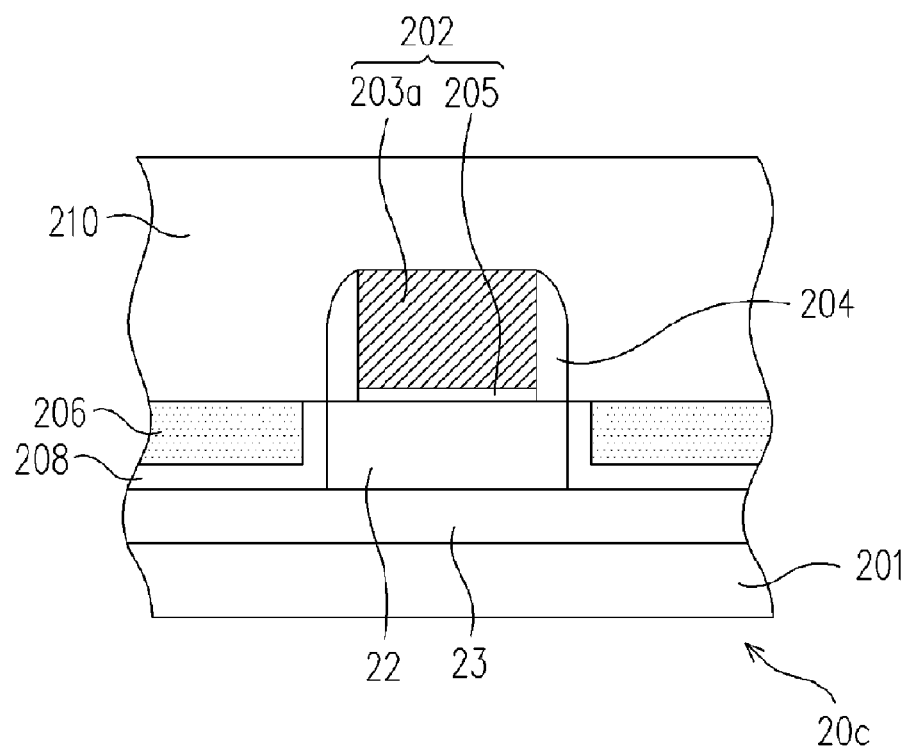
FIG. 1C is a schematic cross-sectional view of a MOS transistor device according to yet another embodiment of the present invention.

As shown in FIG. 1C, the substrate of the MOS transistor device 20c has a composite structure comprising a silicon layer 201, an insulating layer 23 and a channel layer 22. The channel layer 22 is an epitaxial layer, a silicon germanium layer or a silicon carbide layer, for example. In other words, the composite substrate can be an epitaxial silicon on insulator substrate, an silicon germanium on insulator substrate or a silicon carbide on insulator substrate, for example.

Figure 1D:
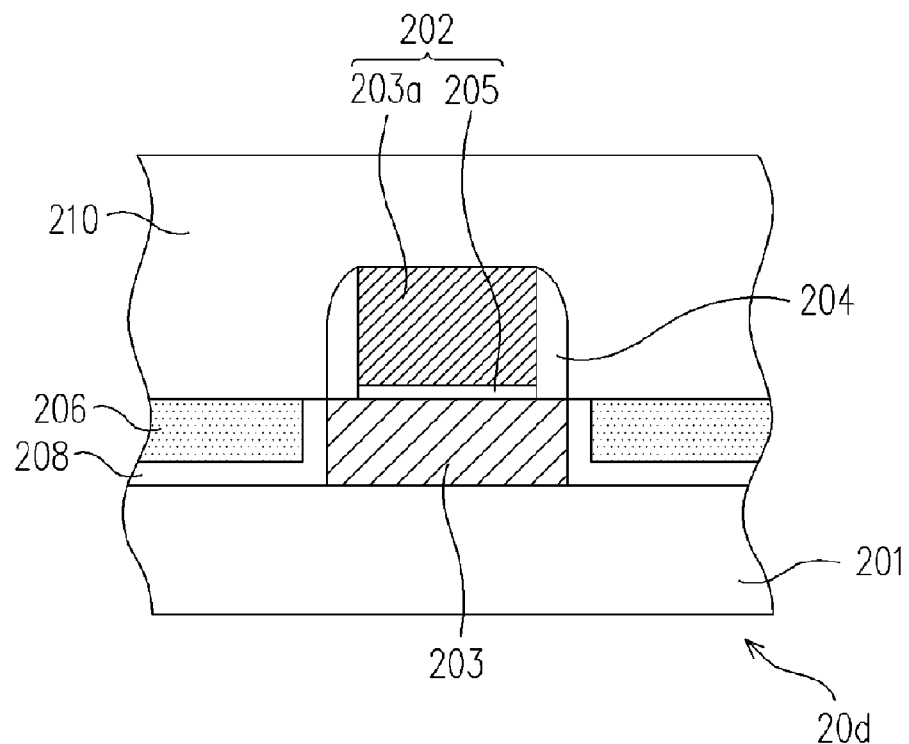
FIG. 1D is a schematic cross-sectional view of a MOS transistor device according to yet another embodiment of the present invention.

In another embodiment as shown in FIG. 1D, the substrate of the MOS transistor device 20d can have a bi-layered structure comprising a silicon layer 201 and a stress layer 203. The stress layer 203 can be a germanium layer, a silicon germanium layer or a silicon carbide layer, for example.

Figure 1E:
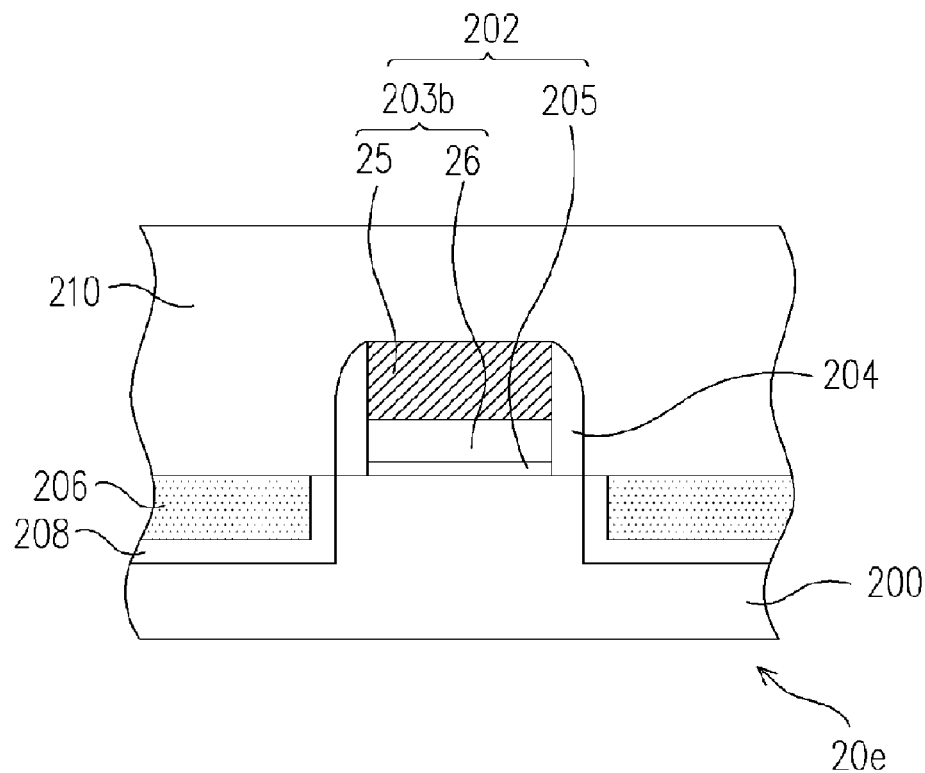
FIG. 1E is a schematic cross-sectional view of a MOS transistor device according to yet another embodiment of the present invention.

In another embodiment as shown in FIG. 1E, the gate 203a of the MOS transistor 20a can have a composite structure. The gate 203b of the MOS transistor 20e comprises a polysilicon layer 25 and a metal nitride layer 26 disposed underneath the polysilicon layer 25. The metal nitride layer 26 is a titanium nitride layer, for example.

Figure 1F:
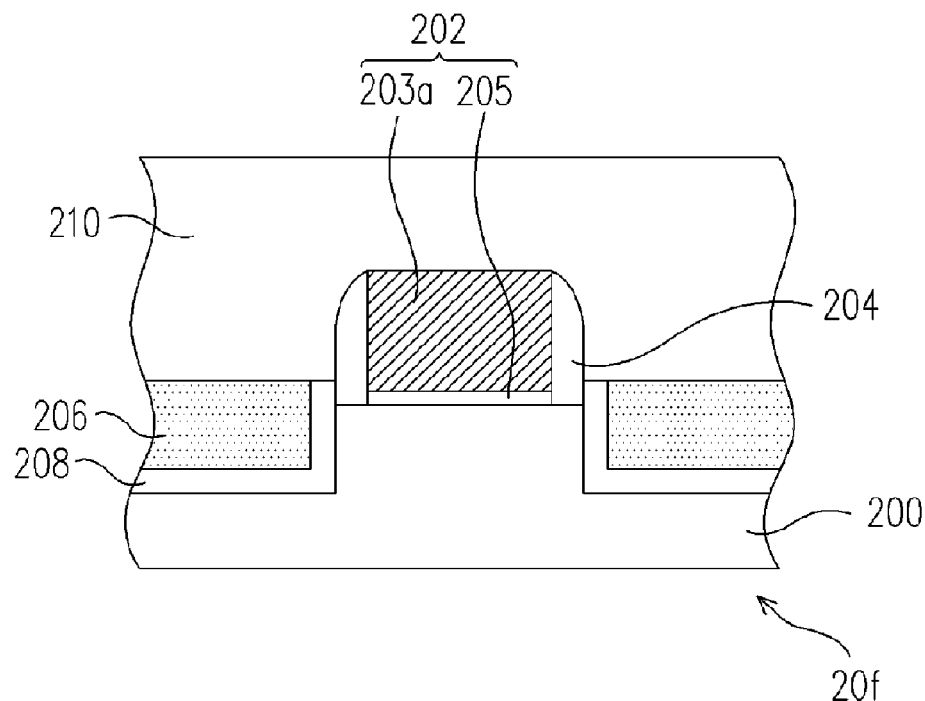
FIG. 1F is a schematic cross-sectional view of a MOS transistor device according to yet another embodiment of the present invention.

The top surfaces of the source/drain regions 206 and the barrier layer 208 in aforementioned MOS transistors 20a, 20b, 20c, 20d and 20e is at the same level as the top surface of their respective substrates. In other embodiments as shown in FIG. 1F, the upper surfaces of the source/drain regions 206 and the barrier layer 208 in MOS transistors 20f can be higher than the substrates. Furthermore, a layer of silicide can also be disposed on top of the source/drain regions of all of the aforesaid MOS transistors 20.

It should be noted that the aforesaid substrates and gates can be combined according to the needs of the users.

In the following, the process of forming the MOS transistor device 20a is used as an example to illustrate the method of fabricating MOS transistor devices in general.

Figure 2A:
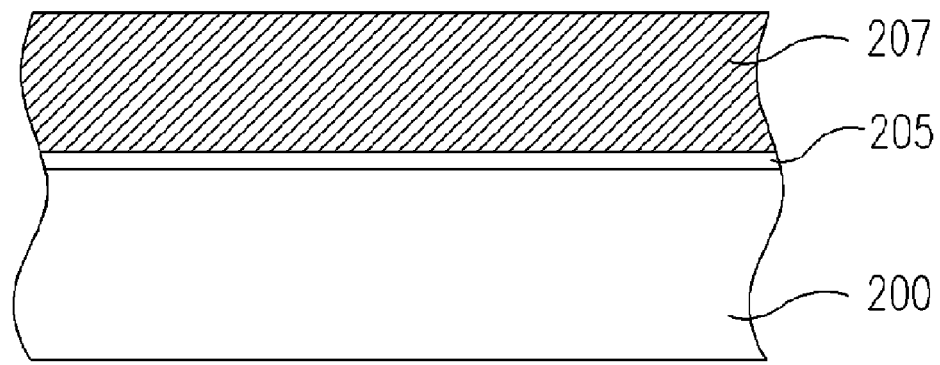
FIGS. 2A through 2C are schematic cross-sectional views showing the steps for fabricating a MOS transistor device according to one embodiment of the present invention.
Figure 2B:
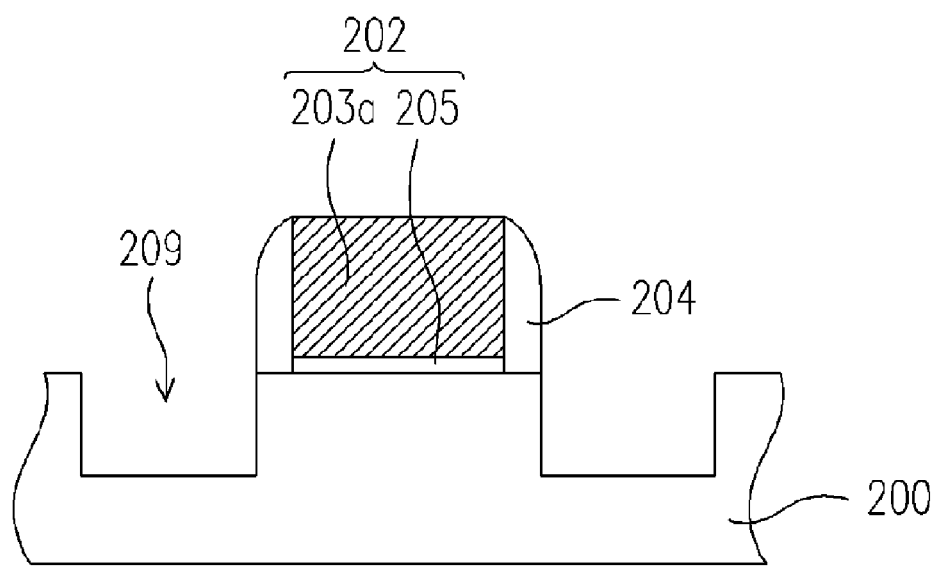
Figure 2C:
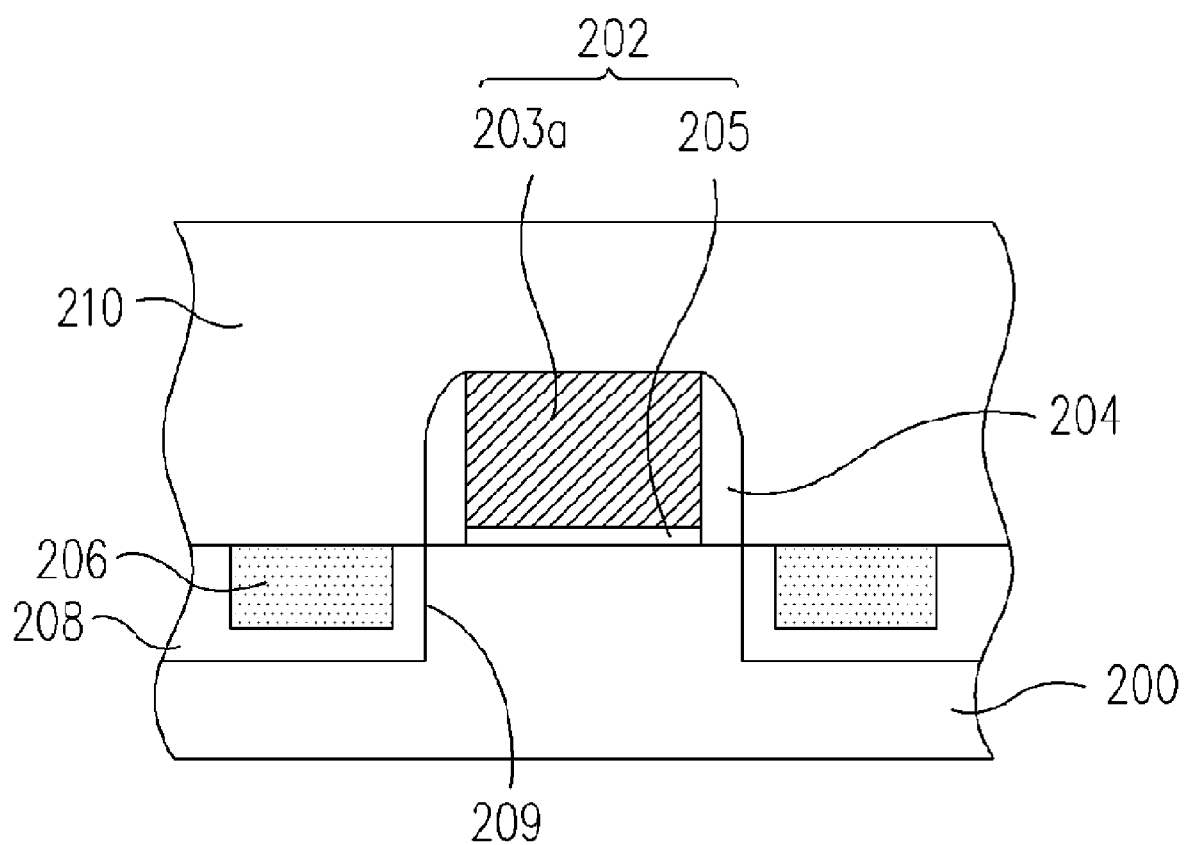

FIGS. 2A through 2C are schematic cross-sectional views showing the steps for fabricating a MOS transistor device according to one embodiment of the present invention. As shown in FIG. 2A, a substrate 200 is provided. Then, a gate dielectric layer 205 and a conductive material layer 207 are sequentially formed over the substrate 200.

As shown in FIG. 2B, the conductive material layer 207 and the gate dielectric layer 205 are etched to form a gate structure 202 comprising a gate 203a and a gate dielectric layer 205. Then, a spacer 204 is formed on the respective sidewalls of the gate structure 202. Thereafter, an etch process is performed to form an opening 209 in the substrate 200 on the side of the respective spacers 202. It should be noted that the gate 203a could be formed by a replace gate method in another embodiment.

As shown in FIG. 2C, a barrier layer 208 is formed on the surface of the opening 209. The barrier layer 208 is formed, for example, by performing a chemical vapor deposition process. After forming the barrier layer 208, the deposition process is continued with the simultaneous passage of doping gases to form the source/drain regions 206. After that, a dielectric layer 210 is formed over the substrate 200.

In summary, the MOS transistor device in the present invention uses boron-doped silicon germanium in PMOS transistor region or phosphorus- or arsenic-doped silicon carbide in NMOS transistor region to form the source/drain region so that a compressive stress or a tensile stress is produced in the vertical direction of the PMOS or NMOS transistor devices. As a result, the mobility of holes and electrons is raised to increase the driving current and improve device performance. Furthermore, a barrier layer fabricated using silicon germanium or silicon carbide is disposed around the source/drain region. Hence, when the MOS transistor device is subjected to subsequent heat treatment processes, the boron, phosphorus or arsenic dopants within the source/drain region are prevented from diffusing into channel layers by the barrier layer causing possible device punch through. Ultimately, a higher strained channel can be maintained for improving device performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A metal-oxide-semiconductor (MOS) transistor device, comprising:
   a substrate;
   a gate structure disposed on the substrate, wherein the gate structure further includes a gate and a gate dielectric layer disposed between the gate and the substrate;
   a spacer disposed on the respective sidewalls of the gate structure;
   a source/drain region disposed in the substrate on two sides of the spacer; and
   a barrier layer around the source/drain region having dopants being of no more than one conductive type, wherein the source/drain region and the barrier layer are fabricated using an identical material and the source/drain region has a dopant concentration higher than the barrier layer.

2. The MOS transistor device of claim 1, wherein material constituting the source/drain region and the barrier layer includes silicon germanium.

3. The MOS transistor device of claim 2, wherein the dopants inside the source/drain region include boron.

4. The MOS transistor device of claim 2, wherein the concentration of dopants in the barrier layer is zero.

5. The MOS transistor device of claim 1, wherein the material constituting the source/drain region and the barrier layer includes silicon carbide.

6. The MOS transistor device of claim 5, wherein the dopants in the source/drain region include phosphorus or arsenic.

7. The MOS transistor device of claim 5, wherein the concentration of dopants in the barrier layer is zero.

8. The MOS transistor device of claim 1, wherein the surface of the source/drain region is at higher level than the surface of the substrate.

9. The MOS transistor device of claim 1, wherein the substrate is selected from a group consisting of P-doped silicon substrate, N-doped silicon substrate, silicon-on-insulator (SOI) substrate, silicon carbide on insulator substrate, silicon germanium on insulator substrate, gallium arsenic substrate, indium-phosphorus substrate, silicon germanium substrate, a substrate comprising a germanium layer disposed over a silicon layer, a substrate comprising a silicon carbide layer disposed over a silicon layer and a substrate comprising a silicon germanium layer over a silicon layer.

10. The MOS transistor device of claim 1, wherein the material constituting the gaze is selected from a group consisting of polysilicon, metal, polycide and composite layer comprising polysilicon and metal nitride.

11. The MOS transistor device of claim 10, wherein if the material constituting the gate is the composite layer comprising the polysilicon and the metal nitride, the metal nitride includes titanium nitride.

12. The MOS transistor device of claim 1, wherein the material constituting the gate dielectric layer includes silicon oxide, silicon oxynitride or high dielectric constant material.

13. The MOS transistor device of claim 12, wherein if the material constituting the gate dielectric layer is the high dielectric constant material, the material constituting the high dielectric constant material includes tantalum oxide or barium-strontium titanate.

14. The MOS transistor device of claim 1, wherein the material constituting the spacer includes silicon oxide or silicon nitride.

15. The MOS transistor device of claim 1, wherein the device further includes a metal silicide layer disposed on the source/drain region.

16. The MOS transistor device of claim 15, wherein the material constituting the metal silicide layer includes tungsten silicide, titanium silicide, cobalt silicide, molybdenum silicide, nickel silicide, palladium silicide or platinum silicide.

17. The MOS transistor device of claim 1, wherein the device further includes a dielectric layer disposed on the substrate.

18. The MOS transistor device of claim 11, wherein the material constituting the dielectric layer includes silicon oxide, borophosphosilicate glass, phosphosilicate glass or low dielectric constant material.

19. The MOS transistor device of claim 18, wherein if the material constituting the dielectric layer is the low dielectric constant material, the low dielectric constant material includes black diamond, aromatic hydrocarbon (SiLK), porous aromatic hydrocarbon (porous-SiLK), hydrogen silsesquioxane (HSQ) or methyl silsesquioxane (MSQ).

* * * * *